United States Patent [19]
Nakamura et al.

[11] 4,257,011
[45] Mar. 17, 1981

[54] SEMICONDUCTOR LASER DEVICE

[75] Inventors: Michiharu Nakamura, Hinodemachi; Shigeo Yamashita, Hachioji; Takao Kuroda, Kokubunji; Jun-ichi Umeda, Hachioji, all of Japan

[73] Assignee: Hitachi, Ltd., Japan

[21] Appl. No.: 929,013

[22] Filed: Jul. 28, 1978

[30] Foreign Application Priority Data

Aug. 1, 1977 [JP] Japan ............................. 52-91368
Mar. 24, 1978 [JP] Japan ........................ 53-36912[U]

[51] Int. Cl.$^3$ .............................................. H01S 3/19
[52] U.S. Cl. ................................. 331/94.5 H; 357/18
[58] Field of Search ................. 331/94.5 H; 357/17, 357/18

[56] References Cited

U.S. PATENT DOCUMENTS

| | | | |
|---|---|---|---|
| 3,978,428 | 8/1976 | Burnham et al. | 331/94.5 H |
| 4,023,993 | 5/1977 | Scifres et al. | 148/172 |
| 4,025,939 | 5/1977 | Aiki et al. | 357/18 |

FOREIGN PATENT DOCUMENTS 2348589  11/1977  France ............................... 331/94.5 H

OTHER PUBLICATIONS

Yariv et al., "Periodic Structures for Integrated Optics," *IEEE Journal of Quantum Electronics*, vol. QE-13, No. 4, Apr. 1977, pp. 233-253.

Tsang et al., "Lateral Current Confinement by Reverse-Biased Junctions in GaAs-Al$_x$Ga$_{1-x}$As DH Lasers," *APL*, vol. 30, No. 10, May 15, 1977, pp. 538-540.

Nakamura et al., "CW Operation of Distributed-Feedback GaAs-GaAlAs Diode Lasers at Temperatures up to 300 K," *APL*, vol. 27, No. 7, Oct. 1, 1975, pp. 403-405.

K. Aiki et al., "Channeled-Substrate Planar Structure (AlGa) as Injection Lasers," *Applied Physics Letters*, vol. 30, No. 12, Jun. 15, 1977, pp. 649-651.

*Primary Examiner*—James W. Davie
*Attorney, Agent, or Firm*—Craig & Antonelli

[57] ABSTRACT

A semiconductor laser device has stabilized longitudinal and transverse modes without excess optical noise for a modulated signal generated by mode interaction. The fundamental construction of the semiconductor laser device comprises a structure wherein a first semiconductor layer is sandwiched between second and third semiconductor layers which have a greater band gap and lower index of refraction than the first semiconductor layer. That region of at least one of the second and third semiconductor layers which is remote from the first semiconductor layer corresponds substantially to a radiation region and serves as a light non-absorptive region in the shape of a stripe. A semiconductor layer has portions lying on both sides of the semiconductor layer remote from the first semiconductor layer and has an effective complex refractive-index for laser light discontinuous at both ends of the semiconductor layer remote from the first semiconductor layer. Periodic corrugations which intersect orthogonally to the lengthwise direction of the stripe-shaped light non-absorptive region are formed in at least one interface of the semiconductor layers in a manner to include at least a region corresponding to the light non-absorptive region.

30 Claims, 16 Drawing Figures

|←10ns→|

SEMICONDUCTOR LASER DEVICE

BACKGROUND OF THE INVENTION

1. Field of the Invention

The present invention relates to a novel semiconductor laser device. It provides a semiconductor laser device in which longitudinal and transverse modes are stabilized.

2. Description of the Prior Art

Semiconductor laser devices have many advantageous properties such as small size, operation at a high efficiency, and the capability of direct modulation by a drive current. They are, therefore, prospective light sources for optical communications, optical information processing systems, etc.

Among various semiconductor lasers, the distributed-feedback semiconductor laser has a corrugated surface therein. It achieves mode stabilization by exploiting a sharp oscillation mode selectivity which is produced by the diffraction effect of light due to the corrugated surface.

Distributed-feedback semiconductor laser devices have been reported in detail in "Appl. Phys. Lett.,", Vol. 27, pp. 403–405, October 1975, by M. Nakamura et al, and in "IEEE J. Quantum Electron" Vol. QE-12, pp. 597–603, October 1976, by K. Aiki et al. A typical example of a distributed-feedback semiconductor laser is one disclosed in U.S. patent application Ser. No. 512,969, filed Oct. 7, 1974, now U.S. Pat. No. 4,178,604, issued Dec. 11, 1979.

Figure 1:
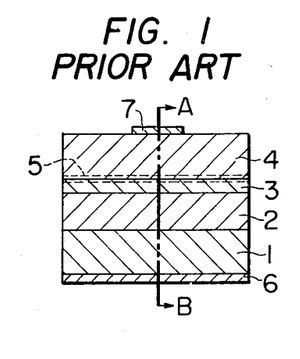
FIGS. 1 and 2 are sectional views of a distributed-feedback semiconductor laser device of a prior art structure, which are respectively taken perpendicularly to the traveling direction of light and along the traveling direction of light.
Figure 2:
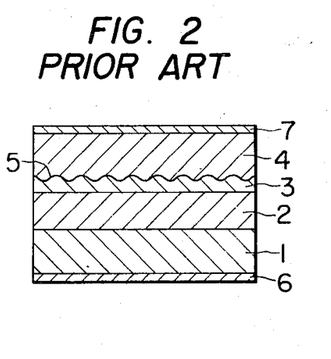

FIGS. 1 and 2 of the accompanying drawings show an example of a distributed-feedback semiconductor laser device. FIG. 1 is a sectional view taken orthogonally to the traveling direction of light, while FIG. 2 is a sectional view taken along the traveling direction of light. Here, numeral 1 designates an n-GaAs substrate, numeral 2 an n-$Ga_{1-x}Al_xAs$ layer ($x \approx 0.3$), numeral 3 a GaAs active layer, numeral 4 a p-$Ga_{1-x}Al_xAs$ layer, and numeral 5 periodic corrugations which are provided at the boundary between the semiconductor layer 3 and the semiconductor layer 4. Numerals 6 and 7 indicate ohmic electrodes. The layers 2, 3, and 4 constitute an optical waveguide. Light generated in the active layer 3 is centered around the layer 3, and is subjected to a Bragg reflection of 180° by the periodic corrugations 5 formed at the boundary between the layers 3 and 4.

A distributed-feedback semiconductor laser device oscillates at a single longitudinal mode and exhibits a spectral width of 0.5 Å or less, so that it has excellent monochromaticity. In addition, the temperature-dependency of the oscillation wavelength is low.

Even in a distributed-feedback semiconductor laser device controlled to have a single longitudinal mode, however, the generation of excess optical noise, especially for a modulated signal, due to transverse mode instability cannot be prevented.

On the other hand, a buried heterostructure semiconductor laser device has been proposed as a typical semiconductor laser device. This structure is provided with an optical waveguide which produces the effect of confining lateral carriers and light in the direction of the thickness of an active layer. An example of a buried heterostructure semiconductor laser device of this sort is described in pending U.S. patent application Ser. No. 786,758, filed Apr. 2, 1974, assigned to Hitachi, Ltd.

Even in buried heterostructure semiconductor laser devices oscillating at a single transverse mode, however, the generation of the excess optical noise due to mode interaction is unavoidable.

SUMMARY OF THE INVENTION

The present invention has for an object the provision of a novel semiconductor laser device in which longitudinal and transverse modes are stabilized singly and in which excess optical noise components for a modulated signal are not generated by mode interaction.

In order to accomplish this object, the structure described below is employed. A first semiconductor layer is disposed, and second and third semiconductor layers which have greater band gap and lower index of refraction than the first semiconductor layer are disposed, in a manner to sandwich the first semiconductor layer therebetween, whereby a double-heterostructure is constructed. With this structure, light is confined in the vicinity of the active layer.

A semiconductor substrate on which the respective semiconductor layers are disposed is prepared. In some cases, a semiconductor layer or layers are further stacked in addition to the semiconductor layers constituting the double-heterostructure. Optical confinement is effected by the structure as described above. Subsequently, that region of at least one of the second and third semiconductor layers which is remote from the first semiconductor layer is formed of a semiconductor layer which corresponds substantially to a radiation region and which functions as a light non-absorptive region in the shape of a stripe. Further, a semiconductor layer is disposed which has portions lying on both sides of the semiconductor layer remote from the first semiconductor layer and which has a complex refractive index for laser light discontinuous at both the ends of the semiconductor layer remote from the first semiconductor layer. Periodic corrugations which intersect orthogonally to the lengthwise direction of the stripe-shaped light non-absorptive region are formed in at least one interface among the aforecited semiconductor layers.

DETAILED DESCRIPTION

Figure 3:
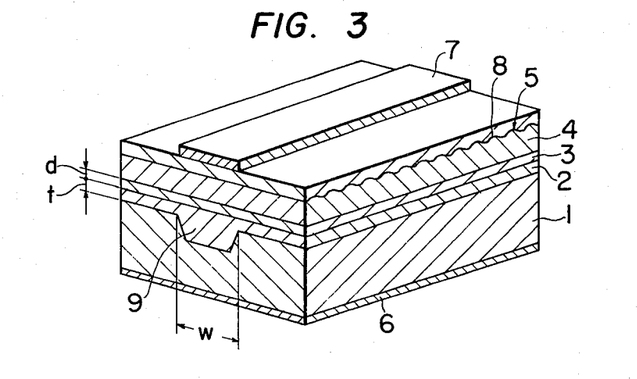
FIG. 3 is a perspective view of a semiconductor laser device according to the invention.

The invention will be described in detail with reference to a typical example. FIG. 3 is a perspective view of the typical example of the invention.

On an n-GaAs substrate 1 formed with a groove 9 an n-Ga$_{1-x}$Al$_x$As($x \approx 0.3$) layer 2, a GaAs active layer 3, and a p-Ga$_{1-y}$Al$_y$As ($y \approx 0.3$) layer 4 are successively formed by well known liquid-phase epitaxy. The upper surface of the semiconductor layer 4 is formed with periodic corrugations 8. Numerals 6 and 7 designate ohmic electrodes.

In the present structure, light generated in the active layer 3 is confined in the vertical direction around the active layer by the double-heterostructure. Part of the light travels to the GaAlAs layers 2 and 4. The light having travelled to the GaAlAs layer 2 reaches the GaAs substrate 1 in regions on both the sides of the groove 9 because the n-Ga$_{1-x}$Al$_x$As layer in these regions is thin. As a consequence, a complex refractive index for the light becomes different between the region corresponding to the groove 9 and the regions corresponding to both sides of the groove 9. For this reason, any higher order mode oscillation spreading beyond the groove and deviation of the oscillation region are suppressed, and the effect that the light is stably confined only to the region of the groove 9 in the lateral direction is produced.

On the other hand, the periodic corrugations 8 are provided at the interface between semiconductor layers 4 and 5. Therefore, the effective complex refractive index $n_e$ for the light given forth in the active layer 3 varies periodically in the traveling direction of the light. $n_e$ can approximately be expressed as follows:

$$n_e = n^o + \sum_{1}^{\infty} \Delta n^{(l)} \cos\left(\frac{2\pi}{\Lambda} lz\right)$$

$$l = 1, 2, 3 \ldots$$

The traveling direction of the light is taken in the z-direction. Therefore, the laser light is diffracted, and $$\lambda = 2n_g \Lambda / l$$

where $\lambda$ is the wavelength of the light, $n_g$ is the effective refractive index of the waveguide, $\Lambda$ is the period of the corrugations and l is the order of diffraction. By fulfilling this condition, the light is subjected to a Bragg reflection of 180°. Accordingly, the light is confined in the waveguide and laser oscillation becomes possible.

In the foregoing, the fundamental operation of the semiconductor laser of this invention has been explained. In order to realize the semiconductor laser intended by the invention, wherein longitudinal and transverse modes are stabilized the generation of an excess optical noise component for a modulated signal due to mode interaction is avoided, a construction as described below is required.

The width of the stripe-shaped light non-absorptive region corresponding substantially to the radiation region is 2 μm to 8 μm. With widths below 2 μm, the threshold current density (the lowest current density necessary for attaining the laser oscillation) increases rapidly. With widths above 8 μm, instability of the transverse mode increases.

As the quantity of evanescence of light to the regions on both the sides of the light non-absorptive region and which make the complex refractive index for the laser beam discontinuous, at least $3 \times 10^{-2}\%$ of the whole quantity of the light, preferably $5 \times 10^{-2}\%$ to $5 \times 10^{-1}\%$ of the same is appropriate. Thus, the absolute value of the index difference $|\Delta n|$ in both the regions is preferably $10^{-3}$ to $10^{-2}$. When the quantity of evanescence of the light is too small, the effect of confinement in the lateral direction is unsatisfactory. On the other hand, when the quantity of evanescence of the light is too large, the quantity of absorption of the light increases, and an increase of the threshold current density is incurred. Therefore, the thickness d of the active layer 3 and the thickness t of the semiconductor layer 2 must be selected. The thickness of the active layer is ordinarily set at 0.05 μm to 0.15 μm. When the thickness d of the active layer is 0.1 μm, it is preferable to make the thickness t at most 0.5 μm; when the thickness d is 0.15 μm, it is preferable to make the thickness t at most 0.2 μm; and when the thickness d is 0.05 μm, it is preferable to make the thickness t at most 0.7 μm. Regarding any intervening thickness of the active layer, the thickness of the semiconductor layer 2 may be set by interpolation with the aforecited values.

On the other hand, the distance c between the active layer 3 and the periodic corrugations 8 which are provided at the interface between the semiconductor layers 4 and 5 may be made at most 1 μm, preferably at most 0.5 μm, and at least 0.03 μm. When the distance c is below 0.03 μm, the carrier confinement effect owing to the semiconductor layer 4 becomes insufficient, and an increase of the threshold current density is incurred. When the distance c is above 1 μm, the degree to which the radiation in the active layer encounters the periodic corrugations decreases abruptly, so that laser oscillation of the distributed-feedback type is not executed.

The depth L of the corrugations is desirably selected in a range of 0.01 μm to 0.5 μm. When the depth L is less than 0.01 μm, Bragg reflection of the light owing to the periodic corrugation structure becomes insufficient, and laser oscillation of the distributed-feedback type becomes difficult. Even when the depth L is selected to be greater than 0.5 μm, the light is distributed in a limited range centering around the active layer, so that the intensity of the Bragg reflection becomes substantially constant and that the effect based on the increase of the depth L diminishes.

In the above, the fundamental concept of the invention has been described in connection with an exemplary configuration of the invention illustrated in FIG. 3.

Various modifications can be contrived as to how the light non-absorptive region in the vicinity of the active layer and the regions situated on both sides of the non-absorptive region and for making the complex refractive index for the laser beam discontinuous are provided, at which interface among the stacked semiconductor layers the periodic corrugation is provided. By way of example, the semiconductor layer corresponding to the semiconductor substrate 1 in FIG. 3 may consist of a plurality of layers. It is also possible to form a separate semiconductor layer on the semiconductor substrate and to provide a recess in the semiconductor layer, the recess being used as the groove 9 in FIG. 3. The invention can be achieved even when a discontinuity in only the refractive index (corresponding to the real part of the complex refractive index) is produced. In any case, however, the technical items previously described may be followed.

Although, in examples to be stated later, a GaAs-GaAlAs semiconductor material will be referred to as a useful semiconductive material, it is obvious that the present invention concerns the property of a laser resonator including an optical waveguide and that it is not dependent on the materials used. The invention is, accordingly, applicable not only to semiconductor lasers employing the above-mentioned semiconductor but also to semiconductor lasers employing, for example, a ternary system compound semiconductor such as GaInP, GaAsP, and GaAlSb, and a quaternary system compound semiconductor such as GaInAsP and GaAlAsSb.

Hereunder, the invention will be described in more detail in connection with examples.

EXAMPLE 1

Description will be made with reference to FIG. 3. In an n-GaAs substrate (Te-doped, electron concentration $n \sim 1 \times 10^{18}/cm^3$) 1 having the (100) face as its surface, a groove 9 having a depth of 1.5 $\mu$m and a desired width in a range of 2 $\mu$m to 8 $\mu$m was formed in the [011] orientation. In the formation, conventional photolithography may be employed. As an etching mask, photoresist was directly used. Chemical etching was conducted at 20° C. for about 140 seconds with a mixed solution which contained phosphoric acid, hydrogen peroxide solution and ethylene glycol at mixture ratio of 1:1:3.

On the resultant substrate 1, an n-$Ga_{1-x}Al_xAs$ layer ($x \approx 0.3$, electron concentration $n \sim 5 \times 10^{17}$ cm$^{-3}$) 2 being 0.3 $\mu$m thick, a GaAs layer 3 being 0.1 $\mu$m thick, and a p-$Ga_{1-y}Al_yAs$ layer ($y \approx 0.3$, hole concentration $p \sim 5 \times 10^{17}$ cm$^{-3}$) 4 being 0.2 $\mu$m thick were continuously grown by the conventional liquid-phase epitaxy employing a slide boat.

For the GaAlAs system material, it is common to employ $Ga_{1-z}Al_zAs$ ($0 \leq x \leq 0.3$) for the first semiconductor layer, $Ga_{1-x}Al_xAs$ ($0.1 \leq x \leq 0.9$) for the second semiconductor layer, and $Ga_{1-y}Al_yAs$ ($0.1 \leq y \leq 0.9$) for the third semiconductor layer, where x, y>z, r>z, and y≠r.

Subsequently, corrugations having a period of 3,700 Å and a depth of 1,500 Å were formed in the surface of the semiconductor layer 4. In forming the corrugations, holographic photolithography employing a laser beam and chemical etching were used. More specifically, a film of the positive type photoresist which was 800 Å thick was formed on the surface of the semiconductor layer 4. Subsequently, using an Ar laser at a wavelength of 4,579 Å, an interference fringe was formed on the photoresist. After completing exposure, development was carried out for about one minute with a mixed solution consisting of a developer and water at a ratio of 1:1. In this way, a diffraction grating made of the photoresist was formed. The diffraction grating made of the photoresist was used as a mask, and a mixed solution consisting of phosphoric acid, a solution of hydrogen peroxide and ethylene glycol at a ratio of 1:1:8 was used as an etchant. Periodic corrugations 8 having a depth of 0.15 $\mu$m were formed by the etching at 20° C. for 80 seconds. This method is disclosed in Japanese Laid-Open Patent Application No. 111344/1976, filed Mar. 26, 1975, assigned to Hitachi, Ltd.

Subsequently, a p-$Ga_{1-\gamma}Al_\gamma As$ layer ($\gamma \approx 0.1$ and in general, $0.05 \leq \gamma \leq 0.9$, hole concentration $p \sim 5 \times 10^{17}$ cm$^{-3}$) 5 was formed to a thickness of 2.0 $\mu$m by employing conventional liquid-phase epitaxial growth again. Zn was diffused into a desired region of the p-side surface of the specimen thus formed, whereupon Cr and Au were deposited by vacuum-evaporation so as to form an electrode. The substrate side was lapped down to about 150 $\mu$m, whereupon AuGeNi was brought into close contact to form an electrode. The laser length was made 300 $\mu$m.

As a result, when the groove width was 7 $\mu$m, the laser device oscillated at a threshold value of 110 mA and a wavelength of 8,300 Å, and each of the longitudinal and transverse modes was single and stable. Any excess optical noise otherwise generated by mode competition was not noted.

It is as previously stated that, in the present structure, the width W of the groove 9, the thickness t of the semiconductor layer 2, the thickness d of the active layer 3, the distance C between the active layer and the periodic corrugations, the depth L of the periodic corrugations, etc., have influences on the oscillation characteristics.

Figure 4:
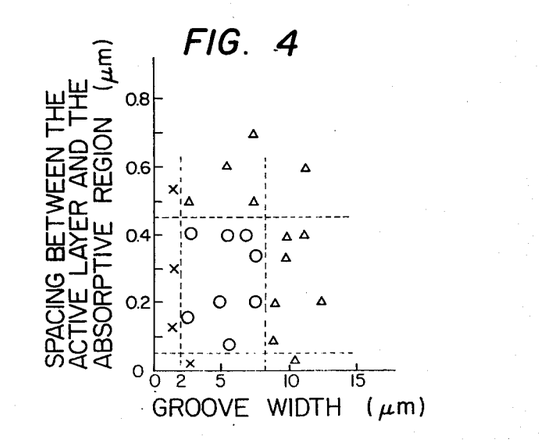
FIG. 4 is a graph showing the relationship between the groove width and the distance from an active layer to a light absorptive region.

FIG. 4 shows the characteristics of semiconductor lasers employing various combinations between the width W of the groove 9 and the thickness t of the semiconductor layer 2. While values of 0.05 $\mu$m to 0.15 $\mu$m are often employed as the thickness d of the active layer, a value of 0.1 $\mu$m is given as a typical example. The depth L of the periodic corrugations is 1,500 Å. The mark O indicates an example in which the laser device oscillated in a single mode longitudinally and transversely without any optical noise. The mark Δ indicates an example in which the laser device oscillated in a single longitudinal mode, but excess optical noise was generated by mode interaction. The mark X indicates an example in which the laser device did not reach continuous oscillation because of an increase in threshold current density.

From these results, it will be understood that the width W of the groove 9 capable of achieving the object is 2 $\mu$m to 8 $\mu$m. Regarding the thickness t of the semiconductor layer 2, a value of 0.05 $\mu$m or less is the limit to which the layer can be stably fabricated in actuality, while a value of 0.45 $\mu$m or greater falls in a region in which a desired light absorption was not attainable.

Figure 5:
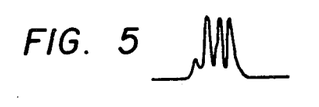
FIGS. 5 through 8 are diagrams showing the states of generation of excess optical noise attributed to mode interaction in various semiconductor laser devices.
Figure 6:
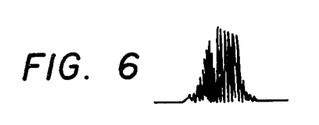
Figure 7:
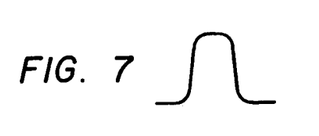
Figure 8:
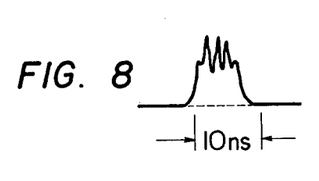

FIGS. 5 through 8 illustrate the states of generation of excess optical noise attributed to mode interaction. A square wave signal current having a pulse width of 8 ns, a pulse height of 160 mA (1.25 times a threshold value) and a frequency of 62.5 MHz was caused to flow through a semiconductor laser device having a threshold current of 130 mA, and the optical output of the semiconductor laser device was observed. The optical output waveform is obtained by conversion into an electric signal with a photodiode of which the wavelength band was the oscillation wavelength ±1 Å and the frequency band was 1 MHz–0.8 GHz. FIG. 5 shows an example of the optical output waveform of the distributed-feedback semiconductor laser device exemplified in FIG. 1. FIG. 6 shows an example of the optical output waveform of a prior art buried heterostructure semiconductor laser device. FIG. 7 shows an example of the optical output waveform of the semiconductor laser device of the invention. FIG. 8 shows an example of the optical output waveform of a semiconductor laser device which has a structure similar to that of the invention but whose stripe-shaped non-absorptive region is as broad as 12 μm. It will be readily appreciated from the optical output waveforms that the semiconductor laser device of the invention is excellent.

The semiconductor laser device of the structure of the example is advantageous in that deterioration is especially small and the transverse mode is more easily stabilized. This originates in that the periodic corrugations can be formed after forming the active layer.

EXAMPLE 2

Figure 9:
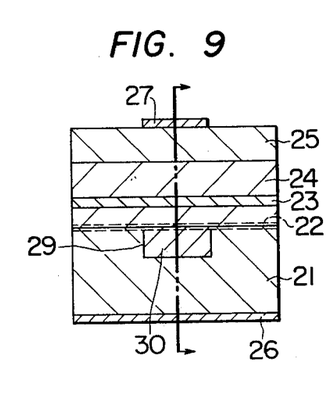
FIGS. 9 and 10 are sectional views of a device of another embodiment of the invention, which are respectively taken perpendicularly to the traveling direction of light and along the traveling direction of light.
Figure 10:
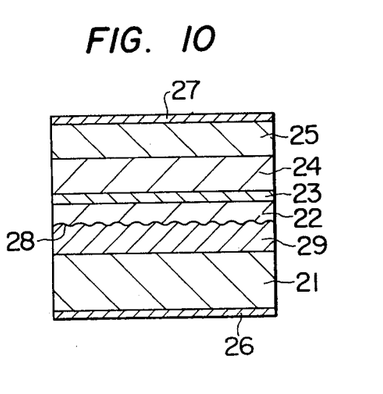

Description will be made with reference to FIGS. 9 and 10.

In the [011] orientation of an n-GaAs substrate 21 (Te-doped, electron concentration n∼1×10$^{18}$ cm$^3$) having the (100) face as its surface, a groove 29 having a depth of about 1.5 μm and a desired width in a range of 2 μm to 8 μm was formed by conventional photolithography and chemical etching. Photoresist was used for an etching mask. Chemical etching was conducted at 20° C. for about 140 seconds with a mixed solution which consists of phosphoric acid, hydrogen peroxide solution and ethylene glycol at a mixture ration of 1:1:3.

On the resultant substrate 21, an n-Ga$_{1-s}$Al$_s$As layer 30 (s=0.07, and in general, 0.1≦s≦0.9, Sn-doped, electron concentration n∼5×10$^{17}$ cm$^3$) was grown to a thickness of 2.0 μm so as to fill up the groove flatly (to the extent that the thickness was about 0.5 μm outside the groove) by conventional liquid-phase epitaxial growth employing a slide boat.

Subsequently, the surface of the grown layer was subjected to the chemical etching until the substrate 21 was exposed on both sides of the groove. Chemical etching was carried out at 20° C. for about 70 seconds by the use of phosphoric acid, hydrogen peroxide solution, and ethylene glycol at a mixture ratio of 1:1:3.

Subsequently, corrugations 28 having a period of 3,750 Å were formed in a direction orthogonal to the groove (in the [011[ orientation) by holographic photolithography employing a laser beam and chemical etching. As a mask at this time, photoresist about 800 Å thick was used. A mixed solution consisting of phosphoric acid, a solution of hydrogen peroxide and ethylene glycol at a mixture ratio of 1:1:8 was employed as an etchant, and etching was conducted at 20° C. for 80 seconds. As a result, the corrugations 28 0.15 μm deep were formed in the crystal surface.

Subsequently, an n-Ga$_{1-x}$Al$_x$As layer 22 (x∼0.3), Sn-doped, electron concentration n∼5×10$^{17}$ cm$^{-3}$) 0.4 μm thick, an n-Ga$_{1-z}$Al$_z$As active layer 23 (x∼0.05, undoped, n=1×10$^{16}$ cm$^{-3}$) 0.1 μm thick, a p-Ga$_{1-x}$Al$_x$As layer 24 (x∼0.3, Ge-doped, hole concentration p=5×10$^{17}$ cm$^{-3}$) 2 μm thick, and a p-GaAs layer 25 (Ge-doped, hole concentration p=5×10$^{17}$ cm$^{-3}$) 1 μm thick were successively grown by employing conventional liquid-phase epitaxial growth with the slide boat again.

Here, the Al contents of the respective layers must be set so that, with respect to light produced in the active layer 23, the substrate 21 becomes an absorptive region, while the stripe-shaped buried layer 30 becomes a non-absorptive region. The composition ratio between the Ga$_{1-s}$Al$_s$As layer 30 and the Ga$_{1-z}$Al$_z$As layer 23 is z<s, and it is desirable that (s−z) be approximately 0.01 or greater. On the other hand, the Al content s of the semiconductor layer 30 may, in principle, be made 0.01≦s<0.9. However, the relationship s<0.1 must be maintained in order that the crystal may be smoothly grown on this layer by liquid-phase epitaxial growth, generally employed. When s>0.1, normal liquid-phase growth becomes difficult in practice. As described above, (s−z) should desirably be approximately 0.01 or greater. Therefore, even where the active layer 23 is a GaAs (z=0 in Ga$_{1-z}$Al$_z$As) layer, it is necessary that s<0.01, and the lower limit value of s becomes 0.01.

Zn was diffused into the p-side surface of this specimen to a depth of approximately 0.1 μm, whereupon Cr and Au were deposited by vacuum-evaporation so as to form an electrode 27. The substrate side was lapped down to approximately 150 μm, whereupon AuGeNi was evaporated to form an ohmic electrode 26.

Figure 11:
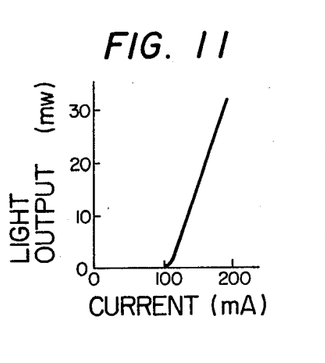
FIG. 11 is a graph showing the light output versus current characteristics of one embodiment of the present invention.
Figure 12:
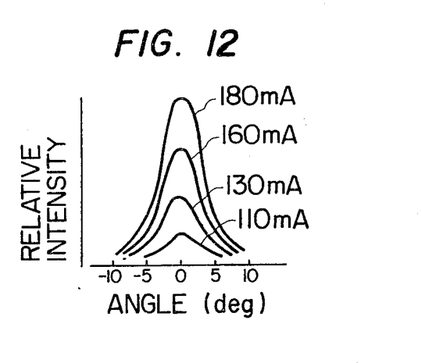
FIG. 12 is a graph showing far-field intensity distributions in the junction plane.

FIG. 11 is a graph showing the light output versus current characteristics of this embodiment, while FIG. 12 is a graph showing the far-field intensity distributions in the junction plane. The results were obtained as to an example in which the semiconductor laser device had a length of 300 μm and a groove width of 7 μm. The threshold current value was 100 mA at room temperature, and the external differential quantum efficiency was about 35%. FIG. 11 corresponds to the light output versus current characteristics at this time. As is apparent from the Figure, the laser oscillated in the fundamental transverse mode, and the transverse mode was stable until above double the threshold value.

Figure 13:
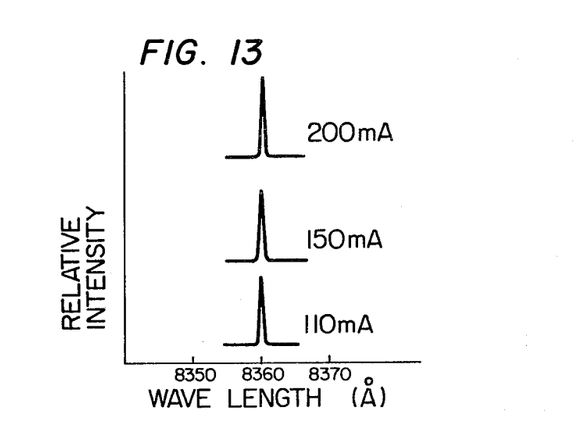
FIG. 13 shows the lasing spectra of one embodiment of the present invention operating under a d.c. bias.
Figure 14:
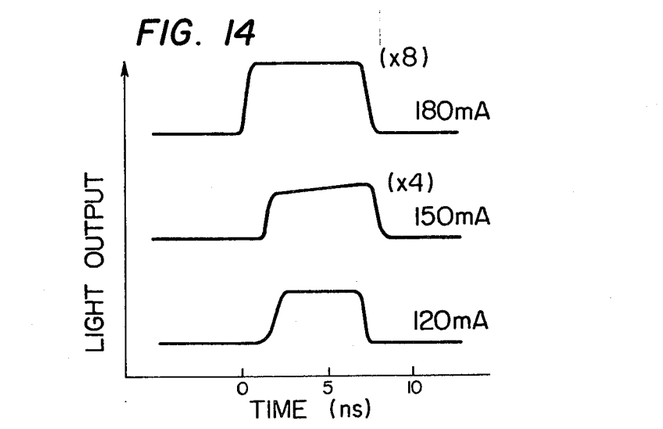
FIG. 14 shows the pulse response of one embodiment of the present invention at different excitation levels.

FIG. 13 shows the lasing spectra of the embodiment. Oscillation arose at a wavelength of 8,360 Å, and even when the current value was increased to double the threshold value, no change was noted. FIG. 14 shows the pulse responses at the time when current pulses having a width of 7 ns were impressed on the present laser device. Since the transverse mode was stabilized, relaxation oscillation as optical noise observed in the prior art distributed-feedback semiconductor laser was not noted.

EXAMPLE 3

Figure 15:
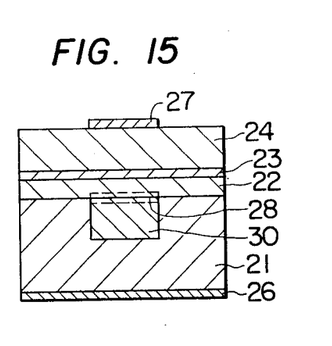
FIGS. 15 and 16 are sectional views of devices of further embodiments of the invention taken perpendicularly to the traveling direction of light.

FIG. 15 depicts another embodiment of the invention, and is a sectional view taken perpendicularly to the traveling direction of light within the laser. In the present element, corrugations 22 were formed on only the surface of a layer 30 grown in a groove. The others were the same as in the case of FIG. 9. In this example, the feedback of light owing to the diffraction effect is selectively attained only in the upper part of the groove, and lasing occurs concentratedly in this part. Therefore, the transverse mode is further stabilized. Where the thickness of the active layer 23 was 0.1 μm and where the thickness of the layer 22 was 0.3 μm, the laser oscillated in the fundamental transverse mode until triple the threshold value. There was no excess optical noise for a modulated signal at the time of modulation as otherwise generated by mode interaction.

EXAMPLE 4

Figure 16:
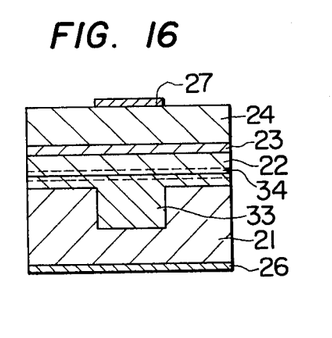

FIG. 16 is a sectional view showing another embodiment of the invention. In the present laser device, an n-Ga$_{1-y}$Al$_y$As layer 33 was grown on the entire surface of an n-GaAs substrate 21 in a manner to fill up the groove of the substrate, and corrugations 34 were formed thereon. The others were the same as in Example 1. In this case, in order for light to travel to the substrate on the lateral outer sides, the sum between the thickness of the layer 33 and the layer 22 must be 0.6 μm or less when the thickness of the active layer is 0.1 μm. By way of example, for a laser wherein the thickness of the layer 33 outside the groove was 0.2 μm, the thickness of the layer 22 was 0.2 μm, the thickness of the active layer was 0.1 μm, the groove width was 7 μm, and the length was 300 μm, the threshold current value of the oscillation was 100 mA and each of the longitudinal and transverse modes was single and stable until above double the threshold value.

With respect to the arrangement of the periodic corrugations and the means for bestowing a difference on the complex refractive index, only examples wherein the means exists on the substrate side have been explained above. The invention, however, is not restricted to such an arrangement, but can adopt different constructions. For instance, a layer overlying an active layer is formed with periodic corrugations, whereupon a layer formed thereon is provided with a protuberance corresponding substantially to a radiation portion. The protuberant layer is made a light non-absorptive layer. On this layer, a layer serving as a light absorptive layer is formed. With such a structure, the same effects as in the foregoing can be achieved. Concrete methods of setting the various constituents may conform with the methods stated in the general description.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A semiconductor laser device comprising:
a first semiconductor layer;
second and third semiconductor layers which sandwich said first semiconductor layer therebetween, which have a greater band gap and lower refractive index than said first semiconductor layer and which have conductivity types opposite to each other;
at least one of said second and third semiconductor layers having a protuberant region which extends in the traveling direction of a generated laser beam and in the shape of a stripe on its surface side remote from said first semiconductor layer;
a semiconductor layer disposed with portions lying on both sides of said protuberant region and which makes the effective complex refractive index for said laser beam discontinuous in a direction perpendicular to said traveling direction of said laser beam;
periodic corrugations formed in at least one interface of the semiconductor layers constituting said semiconductor laser device, in a manner to intersect orthogonally to the lengthwise direction of the stripe of said protuberant region to include at least a region corresponding to the stripe-shaped region of said protuberant region.

2. A semiconductor laser device according to claim 1, wherein the absolute value of the difference between the effective complex refractive indices discontinuous for said laser beam is $10^{-3}$ to $10^{-2}$.

3. A semiconductor laser device according to claim 1, wherein the width of the strip-shaped protuberant region is 2 μm to 8 μm, and the distance from said first semiconductor layer to said periodic corrugations is 0.03 μm to 1 μm.

4. A semiconductor laser device comprising:
a first semiconductor layer;
second and third semiconductor layers which sandwich said first semiconductor layer therebetween, which have a greater band gap and lower refractive index than said first semiconductor layer and which have conductivity types opposite to each other;
at least one of said second and third semiconductor layers having a fourth semiconductor layer which extends in the traveling direction of a generated laser beam and in the shape of a stripe on its surface side remote from said first semiconductor layer;
a semiconductor layer disposed with portions lying on both sides of said fourth semiconductor layer and which makes the effective complex refractive index for said laser beam discontinuous in a direction perpendicular to said traveling direction of said laser beam;
periodic corrugations formed in at least one interface of the semiconductor layers constituting said semiconductor laser device, in a manner to intersect orthogonally to the lengthwise direction of the stripe of said fourth semiconductor layer to include at least a region corresponding to the stripe-shaped region of said fourth semiconductor layer.

5. A semiconductor laser device according to claim 4, wherein the thickness of said first semiconductor layer is 0.05 μm to 0.15 μm.

6. A semiconductor laser device according to claim 4, wherein the width of the strip-shaped fourth semiconductor layer is 2 μm to 8 μm, and the distance from said first semiconductor layer to said periodic corrugations is 0.03 μm to 1 μm.

7. A semiconductor laser device according to claim 4, wherein the absolute value of the difference between the effective complex refractive indices which are discontinuous for said laser beam is $10^{-3}$ to $10^{-2}$.

8. A semiconductor laser device according to claim 6, wherein the thickness of said first semiconductor layer is 0.05 μm to 0.15 μm.

9. A semiconductor laser device comprising:
a first semiconductor layer;
second and third semiconductor layers which sandwich said first semiconductor layer therebetween, have a greater band gap and lower refractive index than said first semiconductor layer, and which have conductivity types opposite to each other;
one of said second and third semiconductor layers having a protuberant region which extends in the traveling direction of a generated laser beam and in the shape of a stripe on its surface side remote from said first semiconductor layer;
a semiconductor layer disposed with portions lying on both sides of said protuberant region and which makes the effective complex refractive index for said laser beam discontinuous in a direction perpendicular to said traveling direction of said laser beam;
the other of said second and third semiconductor layers being formed with periodic corrugations at its surface remote from said first semiconductor layer in a manner to intersect orthogonally to the lengthwise direction of the stripe of said protuberant region; and a fifth semiconductor layer disposed on the surface of said periodic corrugations.

10. A semiconductor laser device according to claim 9, wherein the absolute value of the difference between the effective complex refractive indices discontinuous for said laser beam is $10^{-3}$ to $10^{-2}$.

11. A semiconductor laser device according to claim 9, wherein the width of the strip-shaped protuberant region is 2 μm to 8 μm, and the distance from said first semiconductor layer to said periodic corrugations is 0.03 μm to 1 μm.

12. A semiconductor laser device according to claim 11, wherein the thickness of said first semiconductor layer is 0.05 μm to 0.15 μm.

13. A semiconductor laser device according to claim 9, wherein said semiconductor layer disposed with its portions lying on both sides of said protuberant region is made of a semiconductor substrate which has a groove extending in said traveling direction of said laser beam and in the shape of said stripe.

14. A semiconductor laser device according to claim 13, wherein the width of the stripe-shaped protuberant region is 2 μm to 8 μm, and the distance from said first semiconductor layer to said periodic corrugations is 0.03 μm to 1 μm.

15. A semiconductor laser device according to claim 14, wherein the thickness of said first semiconductor layer is 0.05 μm to 0.15 μm.

16. A semiconductor laser device according to claim 13, wherein said semiconductor substrate is a GaAs substrate, said first semiconductor layer is made of $Ga_{1-z}Al_zAs$ ($0 \leq z \leq 0.3$) said second semiconductor layer is made of $Ga_{1-x}Al_xAs$ ($0.1 \leq x \leq 0.9$), said third semiconductor layer is made of $Ga_{1-y}Al_yAs$ ($0.1 \leq y \leq 0.9$), and said fifth semiconductor layer is made of $Ga_{1-\gamma}Al_\gamma As$ ($0.05 \leq \gamma \leq 0.9$), where x,y>z, γ>z, and y≠γ.

17. A semiconductor laser device comprising:
a first semiconductor layer;
second and third semiconductor layers which sandwich said first semiconductor layer therebetween, have a greater band gap and lower refractive index than said first semiconductor layer, and which have conductivity types opposite to each other;
at least one of said second and third semiconductor layers having a fourth semiconductor layer which extends in the traveling direction of a generated laser beam and in the shape of a stripe on its surface side remote from said first semiconductor layer;
a semiconductor layer disposed with portions lying on both sides of said fourth semiconductor layer and which makes the effective complex refractive index for said laser beam discontinuous in a direction perpendicular to said traveling direction of said laser beam;
periodic corrugations formed at an interface between at least one of said second and third semiconductor layers and said fourth semiconductor layer as well as said semiconductor layer with its portions lying on both the sides of said fourth semiconductor layer, in a manner to intersect orthogonally to the lengthwise direction of the stripe of said fourth semiconductor layer and to include at least an interface region corresponding to said fourth semiconductor layer.

18. A semiconductor laser device according to claim 17, wherein the width of the stripe-shaped fourth semiconductor layer is 2 μm to 8 μm, and the distance from said first semiconductor layer to said periodic corrugations is 0.03 μm to 1 μm.

19. A semiconductor laser device according to claim 18, wherein the thickness of said first semiconductor layer is 0.05 μm to 0.15 μm.

20. A semiconductor laser device according to claim 17, wherein said semiconductor layer disposed with its portions lying on both sides of said fourth semiconductor layer is made of a semiconductor substrate which has a groove extending in said traveling direction of said laser beam and in the shape of said stripe.

21. A semiconductor laser device according to claim 20, wherein the width of the stripe-shaped fourth semiconductor layer is 2 μm to 8 μm, and the distance from said first semiconductor layer to said periodic corrugations is 0.03 μm to 1 μm.

22. A semiconductor laser device according to claim 21, wherein the thickness of said first semiconductor layer is 0.05 μm to 0.15 μm.

23. A semiconductor laser device according to claim 20, wherein said semiconductor substrate is a GaAs substrate, said first semiconductor layer is made of $Ga_{1-z}Al_zAs$ ($0 \leq z \leq 0.3$), said second semiconductor layer is made of $Ga_{1-x}Al_xAs$ ($0.1 \leq x \leq 0.9$), said third semiconductor layer is made of $Ga_{1-y}Al_yAs$ ($0.1 \leq y \leq 0.9$), and said fourth semiconductor layer is made of $Ga_{1-s}Al_sAs$ ($0.01 \leq s \leq 0.9$), where x,y>z, s>z, and x≠s.

24. A semiconductor laser device comprising:
a first semiconductor layer;
second and third semiconductor layers which sandwich said first semiconductor layer therebetween, have a greater band gap and lower refractive index than said first semiconductor layer, and which have conductivity types opposite to each other;
at least one of said second and third semiconductor layers having a fourth semiconductor layer which includes a protuberant region extending in the traveling direction of a generated laser beam and in the shape of a stripe on its surface side remote from said first semiconductor layer;
a semiconductor layer disposed with portions lying on both sides of said protuberant region included in said fourth semiconductor layer and which makes the effective complex refractive index for said laser beam discontinuous in a direction perpendicular to said traveling direction of said laser beam;
periodic corrugations being formed at an interface between at least one of said second and third semiconductor layers and said fourth semiconductor layer, in a manner to intersect orthogonally to the lengthwise direction of the stripe-shaped protuberant region included in said fourth semiconductor layer and to include at least an interface region corresponding to said protuberant region.

25. A semiconductor laser device according to claim 24, wherein the width of said stripe-shaped protuberant region included in said fourth semiconductor layer is 2 μm to 8 μm, and the distance from said first semiconductor layer to said periodic corrugations is 0.03 μm to 1 μm.

26. A semiconductor laser device according to claim 25, wherein the thickness of said first semiconductor layer is 0.05 μm to 0.15 μm.

27. A semiconductor laser device according to claim 24, wherein said semiconductor layer disposed with its portions lying on both sides of said protuberant region included in said fourth semiconductor layer is made of a semiconductor substrate which has a groove extending in said traveling direction of said laser beam and in the shape of said stripe.

28. A semiconductor laser device according to claim 27, wherein the width of the stripe-shaped fourth semiconductor layer is 2 $\mu$m to 8 $\mu$m, and the distance from said first semiconductor layer to said periodic corrugations is 0.03 $\mu$m to 1 $\mu$m.

29. A semiconductor laser device according to claim 28, wherein the thickness of said first semiconductor layer is 0.05 $\mu$m to 0.15 $\mu$m.

30. A semiconductor laser device according to claim 27, wherein said semiconductor substrate is a GaAs substrate, said first semiconductor layer is made of $Ga_{1-z}Al_zAs$ ($0 \leq z \leq 0.3$), said second semiconductor layer is made of $Ga_{1-x}Al_xAs$ ($0.1 \leq x \leq 0.9$), said third semiconductor layer is made of $Ga_{1-y}Al_yAs$ ($0.1 \leq y \leq 0.9$), and said fourth semiconductor layer is made of $Ga_{1-\gamma}Al_\gamma As$ ($0.1 \leq \gamma \leq 0.9$), where x,y>z, $\gamma$>z, and x$\neq$$\gamma$.

* * * * *